(12) United States Patent
Hammett et al.

(10) Patent No.: US 11,523,345 B1
(45) Date of Patent: Dec. 6, 2022

(54) POWER DRAW THROTTLE

(71) Applicant: HEWLETT-PACKARD DEVELOPMENT COMPANY, L.P., Spring, TX (US)

(72) Inventors: Jack Dalton Hammett, Spring, TX (US); Fangyong Dai, Spring, TX (US); ChungJung Chen, Taipei (TW); Lucy Nicole Collins, Spring, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 44 days.

(21) Appl. No.: 17/348,484

(22) Filed: Jun. 15, 2021

(51) Int. Cl.
*H04W 52/02* (2009.01)
*G01R 21/133* (2006.01)

(52) U.S. Cl.
CPC ...... *H04W 52/0277* (2013.01); *G01R 21/133* (2013.01)

(58) Field of Classification Search
CPC .......... H04W 52/0277; H04W 52/0261; G01R 21/133
See application file for complete search history.

(56) References Cited

U.S. PATENT DOCUMENTS

| | | | |
|---|---|---|---|
| 9,411,395 B2 | 8/2016 | Rosenzweig | |
| 9,507,405 B2 | 11/2016 | Krishnaswamy | |
| 9,746,903 B2 | 8/2017 | Suryanarayanan | |
| 2013/0142043 A1* | 6/2013 | Tapia | H04W 28/0268 370/229 |
| 2017/0017286 A1 | 1/2017 | Liu | |
| 2017/0308146 A1 | 10/2017 | Rotem | |

* cited by examiner

*Primary Examiner* — Keith Ferguson
(74) *Attorney, Agent, or Firm* — Fabian VanCott

(57) ABSTRACT

In one example in accordance with the present disclosure, an electronic device is described. An example electronic device a power meter to capture real-time power draw of the electronic device from a power supply. The example electronic device also includes a controller. An example controller determines (1) an average power draw over a first interval, (2) an average power draw over a second interval, and (3) an overall throttle amount for the electronic device based on the average power draw over the first interval and the average power draw over the second interval. The example electronic device also includes a throttling device to reduce the power draw of the electronic device from the power supply based on the overall throttle amount for the electronic device.

15 Claims, 6 Drawing Sheets

POWER DRAW THROTTLE

BACKGROUND

Electronic devices are used by millions of people daily to carry out business, personal, and social operations. Examples of electronic devices include desktop computers, laptop computers, all-in-one devices, tablets, smartphones, wearable smart devices, and gaming systems to name a few. These and other electronic devices may be coupled to an external power supply such as an alternating current (AC) adapter and may also include an internal battery to power the components that provide the intended functionality.

BRIEF DESCRIPTION OF THE DRAWINGS

The accompanying drawings illustrate various examples of the principles described herein and are part of the specification. The illustrated examples are given merely for illustration, and do not limit the scope of the claims.

Figure 1:
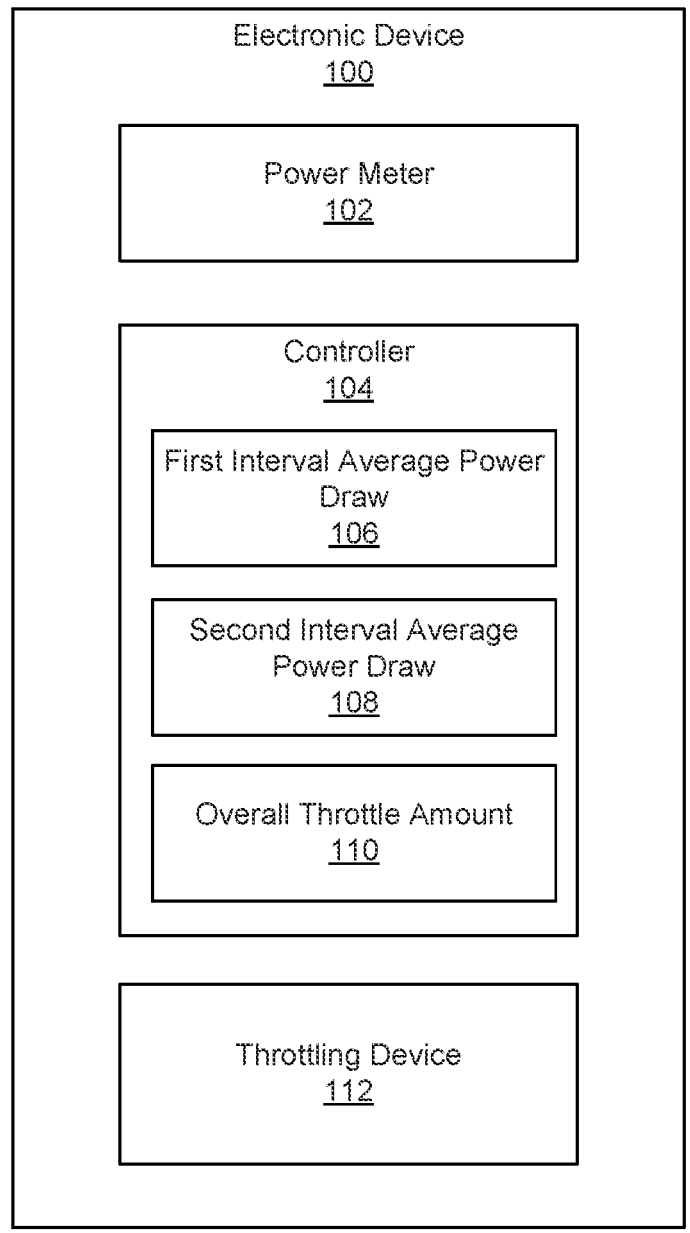
FIG. 1 is a block diagram of an electronic device for throttling an electronic device to reduce a power draw from a power supply, according to an example.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

Electronic devices rely on power supplies to execute their intended functionality. In an example, the power supply may be external to the electronic device. For example, the electronic device may be coupled to alternating current (AC) from a power grid. In this system, an AC adapter may be used to convert the AC power into direct current (DC) power. In another example, the electronic device may rely on its own internal DC battery. Each of these power supply types may have defined operating ranges that if exceeded may damage the power supply and/or the electronic device. One example of such a range is a power supply current flow. That is, a power supply may be rated to provide a specific amount of current. If an electronic device operation triggers a higher current flow than the suggested capacity, then the power supply may become overloaded and/or experience a short circuit. Overload and short circuit scenarios may damage, either temporarily or permanently, the electronic device and/or the power supply. Such overload and/or short circuit may also pose a risk to users of the electronic device and the surrounding environment.

To protect against such scenarios, the power supply may have an over current protection (OCP) mechanism. That is, a power supply may include an over-protection current limit. When this limit is exceeded, the power supply shuts down its output immediately to protect against damage to the power supply. Both AC adapters and batteries may have multiple over current protection (OCP) thresholds, each of which are based on different timescales. For example, a battery may have a higher OCP current threshold over a 2 millisecond (ms) timescale than compared to a OCP current threshold over a 30 ms timescale. Similarly, the 30 ms timescale may have a higher OCP threshold than a 10 second (s) threshold. That is, the components of the power supply may be able to withstand a higher current flow over a shorter period of time.

As a particular example, a battery may have a 7.5 ampere (A) threshold over a 10-second duration, a 12 A threshold over a 30-ms duration and a 35 A threshold over a 2-ms duration. The OCP thresholds for an AC adapter may be different. For example, an AC adapter may have a 3.49 A threshold over a 3-minute duration, a 3.7 A threshold over a 1-minute duration, and a 3.81 A duration over a 30-s duration.

While such OCP thresholds may ensure safe and efficient use of a power supply, some characteristics may impede their more effective use. For example, as described above a battery may have multiple OCP thresholds and battery power down may be triggered by a lower OCP threshold violation. That is, once the lower OCP threshold is violated, the system provides a heavy throttle of electronic device components to reduce the power draw on the power supply. As such, the other higher OCP thresholds defined for the power supply may be ignored.

Triggering a throttling when one threshold is met, may have an impact on performance. For example, processor power draw may be sporadic with temporary periods of larger current draw. An event that triggers this spike in current flow may be referred to as a turbo event. It may be the case that a turbo event violates a low OCP threshold which may result in a heavy throttling of the electronic device. As a result, such turbo events may not be executable if a lowest OCP threshold is used for the electronic device throttle, and these turbo events may result in an over throttling of the electronic device. That is, the OCP thresholds indicate an allowed current load over a period of time. However, these power supplies may be able to handle a turbo event so long as the average draw over the period of time is below the allowed current load. But, as the turbo event peak value may be high, it may trigger a shutdown, notwithstanding the average power draw for the interval being lower than the allowed current load.

As such, the present specification describes an electronic device that aligns the throttle behavior more closely with the multiple OCP thresholds for the power supply such that the electronic device more efficiently utilizes the power supply. Specifically, the present specification describes a throttling mechanism that employs multiple throttle domains in parallel. Each domain targets a specific timescale in the power supply's OCP definitions. Moreover, the throttle amount changes in small steps to achieve a gradual throttling. By matching electronic device throttle behavior with a power supply's OCP definitions in various timescale domains, the overall throttle level is more closely aligned with the power supply capability to reduce the impact on performance that may result when the electronic device is over throttled.

To avoid over throttling, the electronic device includes a component that measures real-time input power. The real-time input power is fed to a controller which executes multiple threads. At the front end of each thread is a timer routine which averages the real-time power input over a different interval. Once the interval expires, the average power over that interval is latched. Each average power draw is then compared with a distinct threshold for that interval. If the latched value is above the respective threshold, then the interval throttle amount is increased by a step size. Otherwise, the interval throttle amount is decreased by the step size. The multiple throttle interval throttle levels are then compared and used to apply a throttle to the electronic device processors, (i.e., central processing unit (CPU) and/or graphics processing unit (GPU).

Specifically, the present specification describes an electronic device. The electronic device includes a power meter to capture real-time power draw of the electronic device from a power supply. The electronic device also includes a controller. The controller determines (1) an average power draw over a first interval, (2) an average power draw over a second interval, and (3) an overall throttle amount for the electronic device based on the average power draw over the first interval and the average power draw over the second interval. The electronic device also includes a throttling device to reduce the power draw of the electronic device based on the overall throttle amount for the electronic device.

In another example, the electronic device includes the power meter and the controller. In this example, the controller determines an average power draw over a first interval and an average power draw over a second interval, wherein the second interval is different than the first interval. The controller also compares, per interval, the average power draw to a distinct threshold for that interval and determines, per interval, an interval throttle amount. Based on a first interval throttle amount and a second interval throttle amount, the electronic device determines an overall throttle amount for the electronic device and the throttling device reduces the power draw of the electronic device based on the overall throttle amount for the electronic device.

The present specification also describes a non-transitory machine-readable storage medium where the term 'non-transitory' does not encompass transitory propagating signals. The non-transitory machine-readable storage medium includes instructions that, when executed by the processor, cause the processor to determine in parallel for a first, second, and third interval that are different from one another (1) a distinct average power draw over each interval and (2) a distinct interval throttle amount based on a comparison of the distinct average power draw over each interval with a threshold unique to each interval. In an example, the interval throttle amount is incremented when the average power draw over that interval is greater than a respective threshold and the interval throttle amount is decremented when the average power draw over that interval is less than the respective threshold. The non-transitory machine-readable storage medium includes instructions that, when executed by the processor, cause the processor to weight a first, second, and third interval throttle amount and select a highest weighted interval throttle amount among a first interval throttle amount, second interval throttle amount, and third interval throttle amount as an overall throttle amount for the electronic device. The non-transitory machine-readable storage medium includes instructions, when executed by the processor, cause the processor to reduce the power draw of the electronic device based on the overall throttle amount for the electronic device.

As used in the present specification and in the appended claims, the term, "controller" may be a processor, an application-specific integrated circuit (ASIC), a semiconductor-based microprocessor, a central processing unit (CPU), and a field-programmable gate array (FPGA), and/or other hardware device.

The memory may include a computer-readable storage medium, which computer-readable storage medium may contain, or store computer-usable program code for use by or in connection with an instruction execution system, apparatus, or device. The memory may take many types of memory including volatile and non-volatile memory. For example, the memory may include Random Access Memory (RAM), Read Only Memory (ROM), optical memory disks, and magnetic disks, among others. The executable code may, when executed by the respective component, cause the component to implement at least the functionality described herein.

Turning now to the figures, FIG. 1 is a block diagram of an electronic device 100 for throttling an electronic device to reduce a power draw from a power supply, according to an example. The electronic device 100 may be of a variety of types including a desktop computer, a laptop computer, a tablet, a smart phone, or any of a variety of other electronic devices 100.

The electronic device 100 includes a power meter 102 to capture real-time power draw of the electronic device 100 from a power supply. That is, electronic devices 100 include various components to perform an intended function. Examples of such components include processors such as a central processing unit (CPU) and a graphics processing unit (GPU), memory devices, transistors, and switches. These components draw power to provide their intended functionality. As such, the electronic device 100 is coupled to a power supply, for example via a power path, which may be a physical cable between an external power supply, or wires connecting an internal battery to the components of the electronic device 100. At any point along this power path, the power meter 102 may be coupled to the cable or wires that connect the power supply to the electronic device 100. As such, the power meter 102 may monitor the power being requested by the electronic device 100 and provided by the power supply. Specifically, a pin on the power meter 102, for example, the Psys pin, may read a current source output which indicates the power consumption for the electronic device 100.

The electronic device also includes a controller 104. As described above, the controller 104 may include a processor and memory and may be tasked with determining interval throttle amounts, which interval throttle amounts represent a suggested throttle amount based on a comparison of the power draw to a threshold for that interval. For example, as described above, the power supply may have different OCP thresholds, indexed by timescale. The controller 104 may compared an averaged measure of the real time power draw against each of these OCP thresholds in determining how to throttle the power draw.

As such, the controller 104 determines a first interval average power draw 106 and a second interval average power draw 108. Note that the intervals may be different than one another. For example, the first interval may be 0.1 ms and the second interval may be 1 ms. As such, the real-time power input received at the controller 104 may be averaged over 0.1 ms to determine the first interval average power draw 106 and may be averaged over 1 ms to determine the second interval average power draw 108.

Based on this information, the controller 104 may determine an overall throttle amount 110 for the electronic device 100 based on both the first interval average power draw 106 and the second interval average power draw 108. That is, each interval power draw may relate to a particular interval throttle amount and the controller 104 relies on these different interval throttle amounts when determining the overall throttle amount 110 for the electronic device 100. Put another way, the interval throttle amounts represent intermediate recommendations based on a comparison of (1) average power draws over a particular interval and (2) a distinct threshold for that particular interval.

As such, the controller 104 may compare, per interval, the average power draw for that interval against a distinct threshold for that interval and based on the comparison, determine an interval throttle amount. In an example, the thresholds, which may be battery OCP thresholds, may be pre-programmed into the non-volatile memory of the battery, and the controller 104 may extract these thresholds by polling the data via an inter-integrated circuit (I2C) interface. The controller 104 may acquire the thresholds from an AC adapter in a different way. For example, when a controller 104 identifies a barrel type AC adapter, the controller 104 may read the OCP thresholds and populate its memory with these values. For a type-C AC adapter, the electronic device 100, or a physical device (PD) controller may extract the thresholds from the AC adapter's type-c communication channel. In this example, the PD controller may pass the OCP thresholds to the controller 104.

As a particular example, the first interval may be 0.1 ms and may have a threshold of 35 A. In this example, the first interval average power draw 106 may be measured to be 36 A over the 0.1 ms. As such, the interval throttle amount may be selected to reduce the load on the power supply, by for example, throttling the components of the electronic device by 5%. By comparison in this same example, the second interval may be 1 ms and may have a threshold of 12 A. In this example, the second interval average power draw 108 may be 11 A. That is, a turbo event may cause the average power draw over 0.1 ms to spike. However, the turbo event may be for such a short period of time that when considered with power draw for the duration of the 1 ms interval, the average power draw remains below the second interval threshold. In this example, the interval throttle amount for the second interval may be 0%, indicating that the intermediary recommendation based on the second interval is to not throttle the electronic device 100 components.

The controller 104 then determines an overall throttle amount 110 for the electronic device 100 based on a first interval throttle amount and the second interval throttle amount. In one example, this may include averaging the interval throttle amounts to arrive at the overall throttle amount 110 for the electronic device 100. Using the example above, the controller 104 may determine the overall throttle amount 110 to be 2.5%.

In another example, determining the overall throttle amount 110 for the electronic device 100 may include selecting a maximum interval throttle amount. Again, using the example above, the controller 104 may determine the overall throttle amount 110 to be 5%. In this example, the determined overall throttle amount 110 for the electronic device 100 is determined based on which of the first interval average power draw 106 and the second interval average power draw 108 is a greater distance away from a respective threshold.

The electronic device 100 may include a throttling device 112 to reduce the power draw from the power supply based on the overall throttle amount 110 for the electronic device 100. That is, the controller 104 determines an overall throttle amount 110 and the throttling device 112 implements the throttling. In an example, throttling the electronic device 100 may include altering a duty cycle of the power supplied. For example, via pulse width modulation, the amount of power received from the power supply may be adjusted by any number of values.

In general, the throttling device 112 may form part of the central processing unit (CPU) and may take many forms. For example, power limit registers within the CPU may define the maximum power in different time domains. For example, a CPU may have power limit registers: PL1, PL2 and PL4 where PL1 is the power level at which the CPU can maintain for an extended period of time; PL2 is the power level at which the CPU may remain for less than 5 seconds; and PL4 is the power level that the CPU can maintain for less than 10 ms. While particular reference is made to particular throttling devices 112, others may be implemented as well. For example, as described above, the throttling device 112 may generate a pulse width modulation (PWM) waveform to regulate power. Other mechanisms for throttling may exist as well.

As such, the present electronic device 100 facilitates efficient power supply management and allows for turbo events without undue throttling on the electronic device 100. For example, the electronic device 100 facilitates processors operating in bursts, i.e., turbo events that draw large amounts of power in short periods of time, all while maintaining overall power in a lower amount over a longer period of time. That is, the present electronic device 100 maximizes power supply usage and reduces unnecessary OCP throttle to enhance electronic device 100 performance. Moreover, the optimized throttle amount may be reached gradually, implementing small step sizes.

Figure 2A:
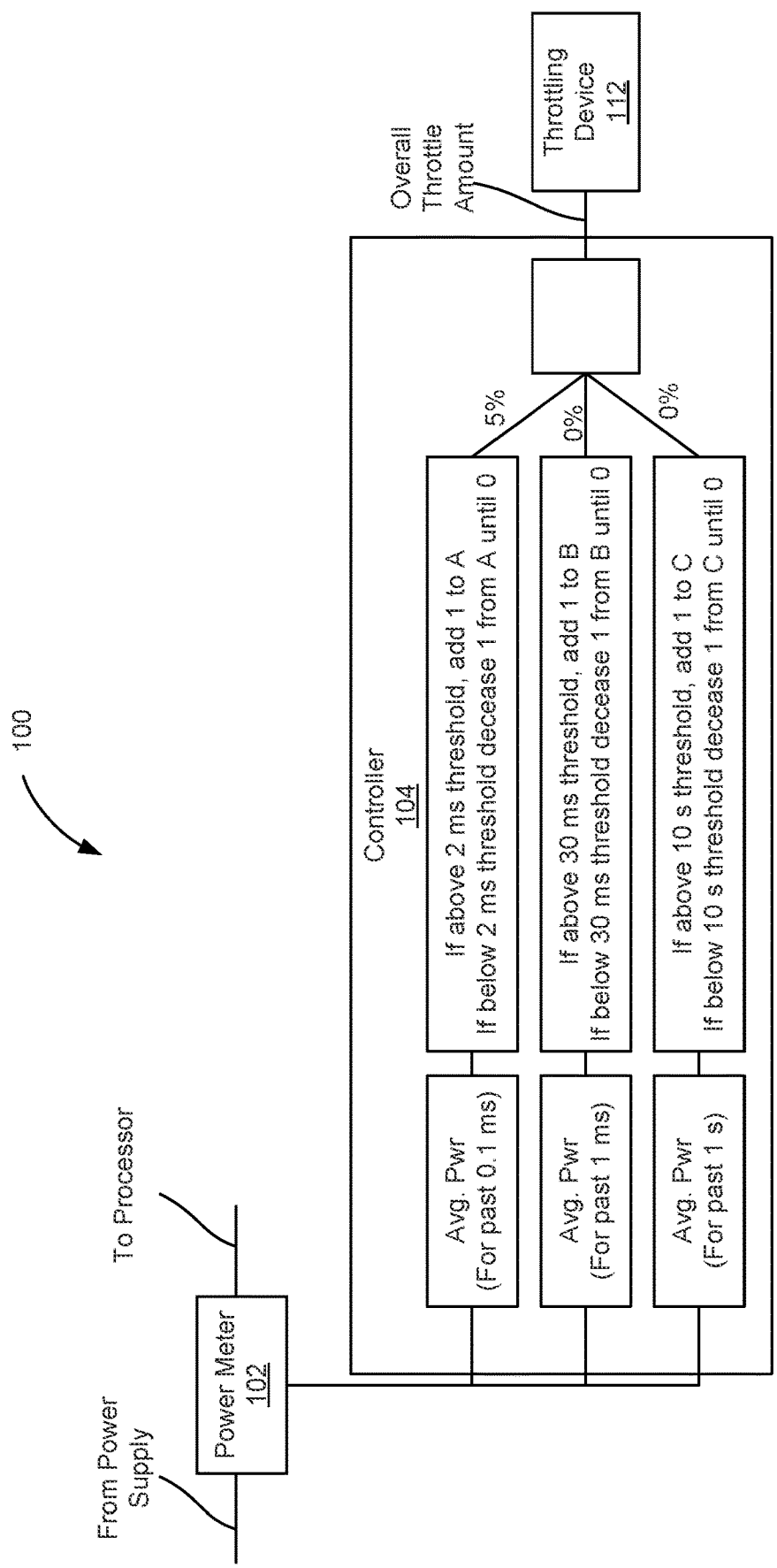
FIGS. 2A-2C are operational diagrams of the electronic device for throttling the electronic device to reduce a power draw from a power supply, according to an example.
Figure 2B:
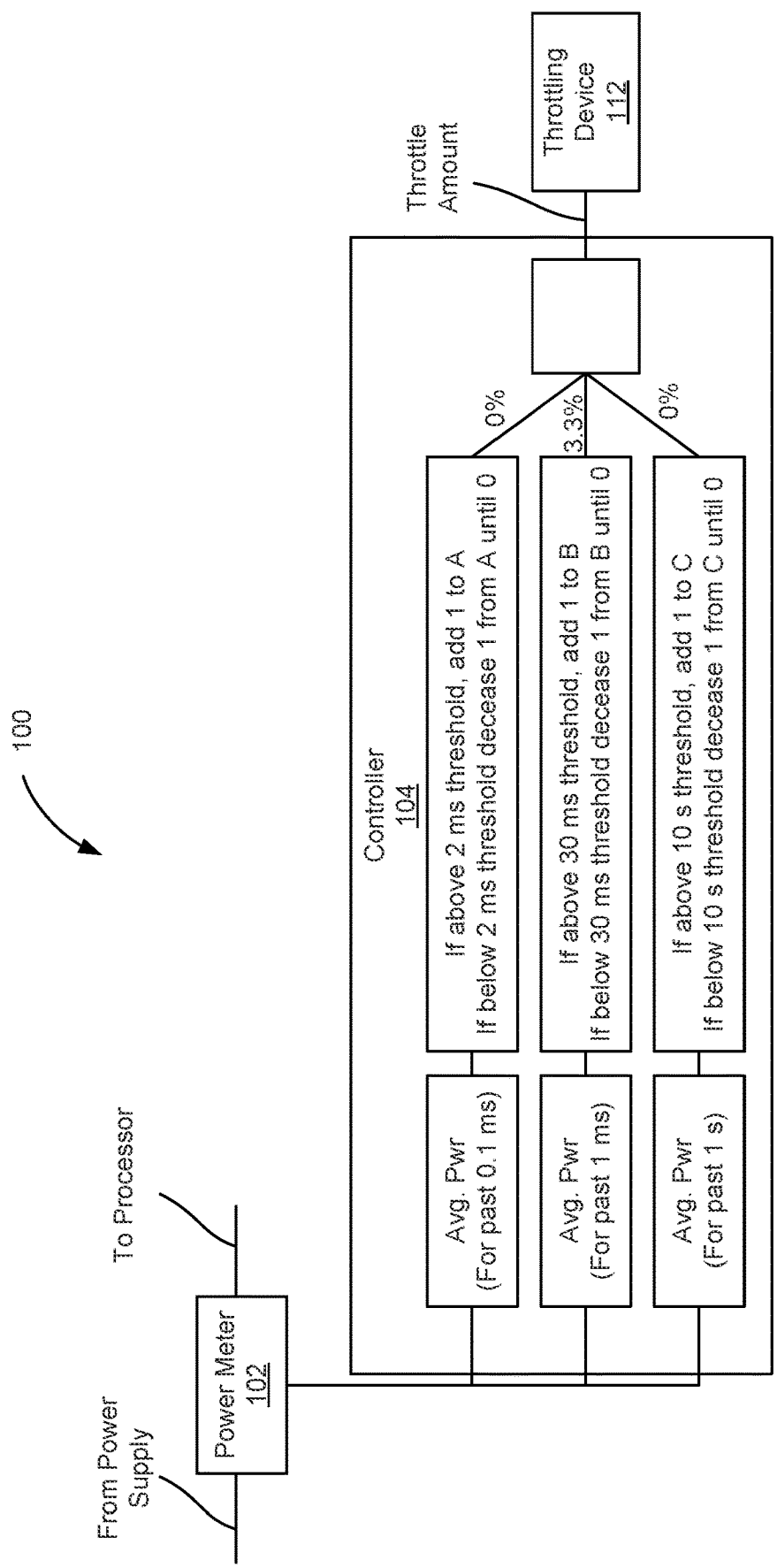
Figure 2C:
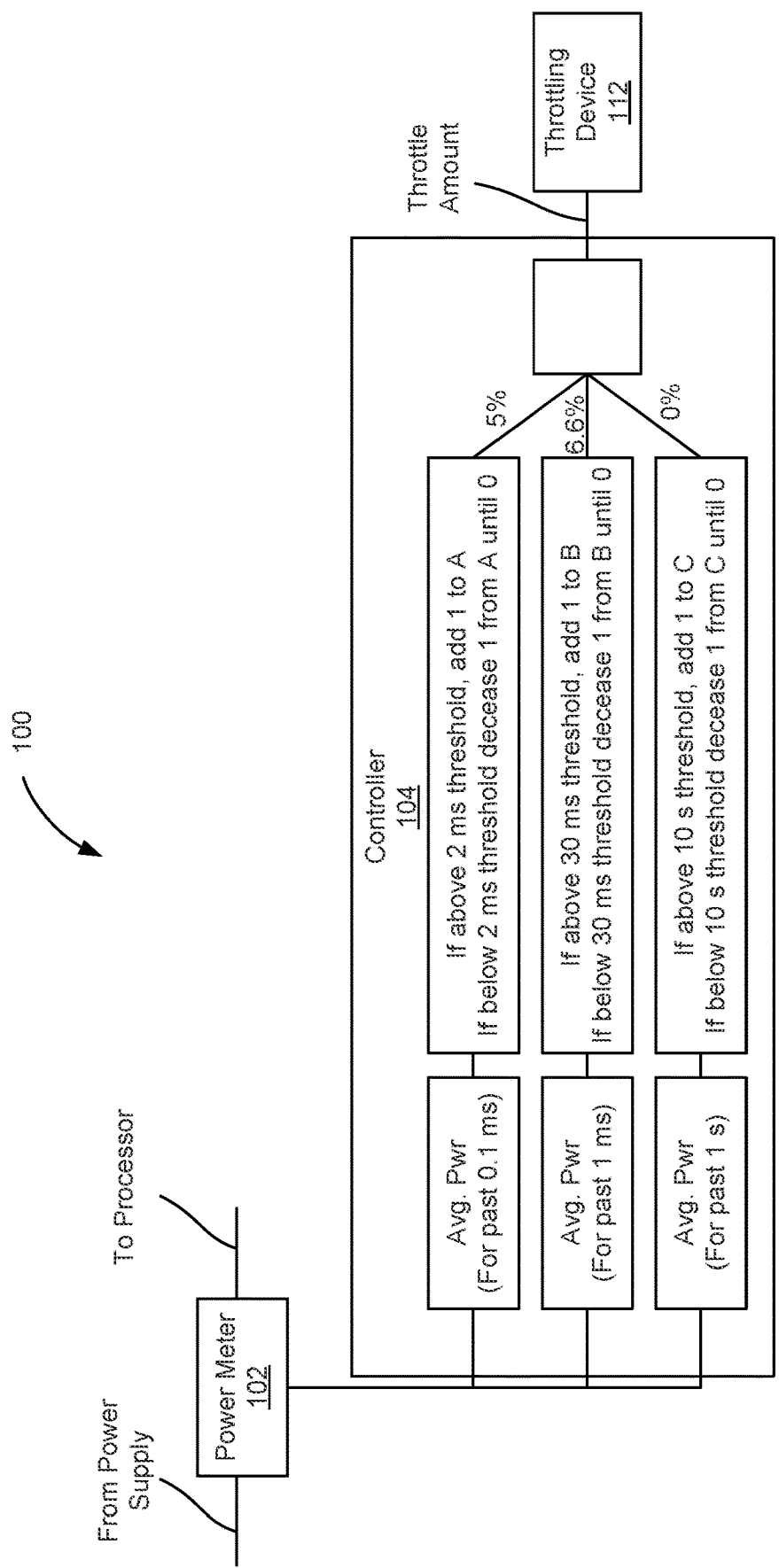

FIGS. 2A-2C are operational diagrams of the electronic device 100 for throttling the electronic device to reduce a power draw from a power supply, according to an example. FIGS. 2A-2C depict interval throttle amounts at various points in time. As described above, the electronic device 100 includes a power meter 102 disposed along a power path from the power supply to the processor or other components of the electronic device 100. The power meter 102 feeds real-time power draw information to the controller 104. The real-time power draw is passed to multiple "threads" or program instruction sets, which analyze the real-time power draw in different ways. Specifically, each thread may average the real-time power draw over different intervals and compare it against thresholds that are unique to each interval and distinct from other thresholds.

As depicted in FIGS. 2A-2C, different timescales may be used in each thread to reflect different power supply OCP thresholds. For example, a first thread may have an interval of 0.1 ms and may be compared against a 2 ms threshold, a second thread may have an interval of 1 ms and may be compared against a 30 ms threshold, and a third thread may have an interval of 1 second and may be compared against a 10 s threshold. As depicted in this example, the first interval is shorter than the second interval, and the second interval is shorter than the third interval. While FIGS. 2A-2C depict various thresholds and intervals, the intervals and thresholds may be selected based on the power supply type. For example, FIGS. 2A-2C depict intervals and thresholds for a particular battery, however different batteries or different power supply types, such as an AC adapter, may implement different intervals and thresholds.

As described above, the electronic device 100 facilitates a higher resolution throttle adjustment. That is, some systems, upon detection of an OCP event may throttle the power supply by a large amount, for example, 70%. That is, upon detection of an OCP event, i.e., a current load larger than a threshold amount, power to the electronic device 100 may be reduced by 70%. In addition to considering multiple criteria for determining an OCP event, the electronic device 100 of the current specification provides a decreased step size such that a more gradual throttling of the electronic device 100 may be implemented. In an example, the step size by which an interval throttle amount is adjusted may be one percent. In another example, the step size may be selected based on a number of sampled intervals taken in a time period associated with the distinct threshold for that interval. For example, given that the first interval is 0.1 ms and the threshold against which it is compared is a 2 ms threshold, the step size may be 5%. That is, for each 0.1 ms interval the throttle amount may be either increased by 5% or decrease by 5%.

Note that the step size for the different intervals may be different. For example, given that the second interval is 1 ms and the threshold against which it is compared is a 3 ms threshold, the step size may be 3.3%. That is, for each 1 ms interval the throttle amount may be either increased by 3.3% or decrease by 3.3%. Still further, given that the third interval is 1 second and the threshold against which it is compared is a 10 s threshold, the step size may be 10%. That is for each 1 s interval, the throttle amount may be either increased or decreased by 10%.

As described above, the controller 104 may latch the interval throttle amount. The interval throttle amount is then compared against a threshold for that interval. When the average power draw is greater than the threshold for that interval, the controller 104 increases the interval throttle amount by the step size. By comparison, when the average power draw is less than the threshold for that interval, the controller 104 decreases the interval throttle amount by the step size, until the interval throttle amount is zero.

For example, given a first interval average power draw of 36 A, which is compared against a 2 ms threshold of 35 A, the controller 104 may increase the first interval throttle amount by the step size, for example from 0% to 5%. This process may be repeated over many instances. For example, given a subsequent average power draw measurement of 36 A, the controller 104 may again increase the first interval throttle amount by the step size, for example from 5% to 10%. That is, for subsequent intervals, the controller 104 may similarly increase the interval throttle amount by the step size when the average power draw for that interval is greater than the threshold for that interval.

For the initial and subsequent intervals, the controller 104 may also decrease the interval throttle amount by the step size when the average power draw is less than the threshold for that interval. For example, given a third average power draw measurement of 12 A, the controller 104 may decrease the interval throttle amount by the step size, for example from 10% to 5%.

Note that the above operations may be performed in parallel for each of the threads and intervals implemented by the controller 104. That is, real-time power draw is collected along each thread, and different average power draws are calculated and compared to different thresholds.

The controller 104 then accounts for each of these interval throttle amounts in determining an overall throttle amount 110 for the electronic device 100. For example, the controller 104 may average the first interval throttle amount, the second interval throttle amount, and the third interval throttle amount. In another example, the controller 104 may simply select a maximum of the interval throttle amounts.

Through FIGS. 2A-2C, an example is now provided. In the example, the first threshold may be a 2 ms threshold with a value of 35 A, the second threshold may be a 30 ms threshold with a value of 12 A, and the third threshold may be a 10 s threshold with a value of 7.5 A. In this example "A" represents the first interval throttle amount, "B" represents the second interval throttle amount, and "C" represents the third interval throttle amount. As real-time power is input to the controller 104, the first interval average power draw 106 may be measured at 36 A due to for example, a fast turbo event. However, given that this is a fast turbo event, the increase spike in current may not affect average power draw over the longer 1 ms second interval, such that the second interval average power 108 draw is 11 A which is under the threshold amount. Similarly, this fast turbo event spike may not affect the average power draw over the even longer 1 s interval, such that the third interval average power draw is 6 A which is under the threshold amount. As such, the first interval throttle amount may be raised by one step size, i.e., 5%, while the second and third interval throttle amounts are not increased. In this example, the controller 104 may select the max, i.e., the first interval throttle amount 106 of 5% as the overall throttle amount 110 for the electronic device 100. As such, the throttling device 112 may throttle the electronic device 100 components, (i.e., the CPU or the GPU by 5% to reduce electronic device 100 power draw.

At a later stage as depicted in FIG. 2B, the first interval average power draw 106 may be measured at 34 A. However, a slow turbo event lasting a few milliseconds may have occurred such that the second interval average power draw 108 is 13 A which is higher than the 12 A 30 ms threshold. As this slow turbo has a longer duration, it may not be detected during the first interval, i.e., 0.1 ms. Moreover, given that this is a slow turbo event, the increase spike may not affect average power draw over the longer 1 s second interval, such that the third interval average power draw is 7 A, still below the 7.5 A 10 s threshold. As a result, the first interval throttle amount may be decreased by one step size, i.e., 5%, while the second interval throttle amount is increased one step size, i.e., 3.3%. Again, the third interval throttle amount may not be increased. In this example, the controller 104 may select the maximum, i.e., the second interval throttle amount of 3.3% as the overall throttle amount 110 for the electronic device 100. As such, the throttling device 112 may throttle the electronic device 100 by 3.3%.

At yet a later stage as depicted in FIG. 2C, a fast turbo event is detected such that average power over 0.1 ms is 37 A. As such, the first interval throttle amount may be raised by one step size, i.e., 5%. At this same stage, a slow turbo event is detected such that the second interval average power draw is 14 A which is higher than the 12 A 30 ms threshold. As such, the second interval throttle amount may be raised by one step size, from 3.3% to 6.6%. In this example, the controller 104 may select the max, i.e., the second interval throttle amount of 6.6% as the overall throttle amount 110 for the electronic device 100. As such, the throttling device 112 may throttle the power draw by 6.6%.

FIGS. 2A-2C depict a simple example of discrete stages where averages are taken. However, such processing may be performed in real time such that each interval throttle amount "A," "B," and "C," are changing at different times to do the different intervals and that as such the interval throttle amounts and overall throttle amount 110 are similarly changing over time.

As depicted in FIGS. 2A-2C, the present electronic device 100 categorizes OCP events by timescale and compares each with respective thresholds, which thresholds are defined by the power supply. By using thresholds in the same timescale as the power supply protocol, adequate reaction time is preserved and unnecessary throttling is avoided. For example, as compared to existing systems, a 1 second throttle will not be triggered by an OCP event having a 20 ms turbo event. Moreover, as the interval throttle amounts and overall throttle amounts 110 are increased or decreased by a small step size, throttling occurs gradually, which results in a more precise and tailored throttling. As such, the present electronic device 100 provides for dynamic and gradual increases to a throttle amount and accounts for the different turbo events that may occur without triggering over throttling when such turbo events are executed.

Moreover, while FIGS. 2A-3C depict three intervals, three thresholds, and three threads having distinct values. The controller 104 may include any number of threads with different values for the intervals and thresholds.

Figure 3:
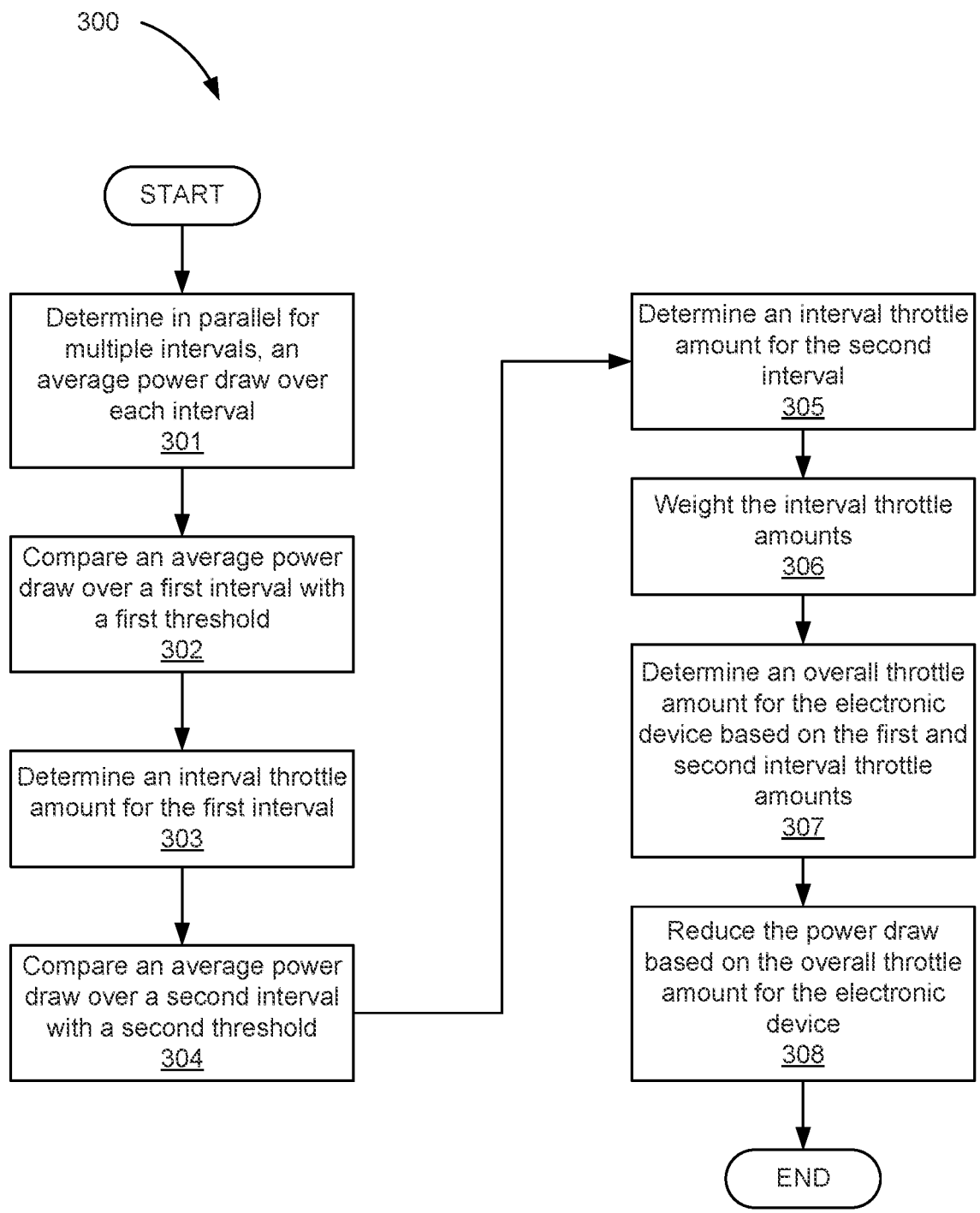
FIG. 3 is a flowchart of a method for throttling an electronic device to reduce a power draw from a power supply, according to an example.

FIG. 3 is a flowchart of a method 300 for throttling an electronic device to reduce a power draw from a power supply, according to an example. At step 301, the method 300 includes determining in parallel for multiple intervals, an average power draw over each interval. That is, real time power measurements are provided to a controller 104 which averages the real time measurements over different intervals. As noted, this may be done in parallel. For example, the controller 104 may determine an average power draw over 0.1 ms, 1 ms, and 1 s. At step 302, the method 300 includes comparing an average power draw over a first interval with a first threshold. Based on the comparison, at step 303, the method 300 includes determining an interval throttle amount for the first interval. That is, the interval throttle amount may be increased or decreased by a step size distinct to the first interval based on whether or not the averaged power draw value is greater than or less than the first threshold.

Similarly, at step 304, the method 300 includes comparing an average power draw over a second interval with a second threshold. Based on the comparison, at step 305, the method 300 includes determining an interval throttle amount for the second interval. That is, the second interval throttle amount may be increased or decreased by a step size distinct to the second interval based on whether or not the averaged power draw value is greater than or less than the second threshold.

At step 306, the method 300 may include weighting the interval throttle amounts. In an example, the weight may be selected based on a property of the power supply and may be different per interval. For example, if an administrator does not want to allow any high-power spikes to stress the electronic device 100, a weight of interval throttle amount associated with the shortest time interval may be increased so as to ensure protection against fast turbo events. Such a weighting may provide a safety routine. For example, a power supply may overstate or understate its OCP thresholds. As such, the weighting allows for adjustment without having to reprogram.

At step 307, the method 300 includes determining an overall throttle amount 110 for the electronic device 100 based on the interval throttle amounts. That is, a highest interval amount may be selected or an average of the interval throttle amounts may be selected. At step 308, the method 300 includes reducing the power draw, i.e., throttling the electronic device 100, based on the overall throttle amount 110 for the electronic device 100.

Figure 4:
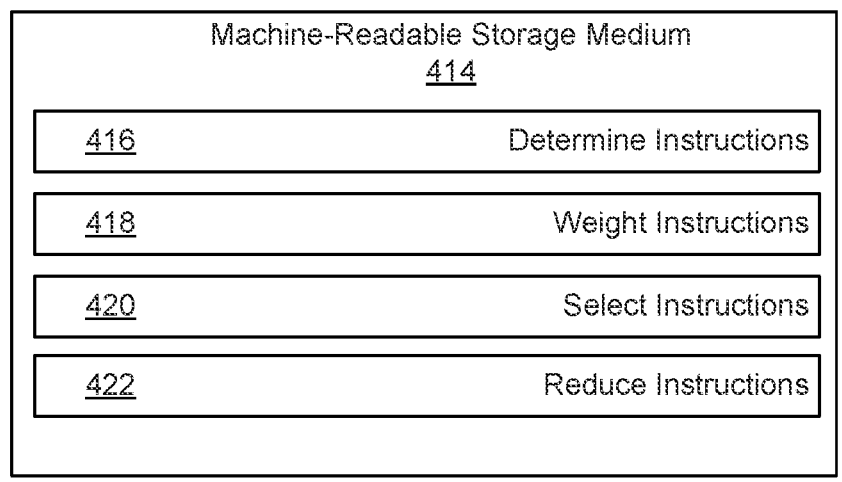
FIG. 4 depicts a non-transitory machine-readable storage medium for throttling an electronic device to reduce a power draw from a power supply, according to an example.

FIG. 4 depicts a non-transitory machine-readable storage medium 414 for throttling a power draw from a power supply, according to an example. To achieve its desired functionality, an electronic device 100 includes various hardware components. Specifically, an electronic device 100 includes a processor and a machine-readable storage medium 414. The machine-readable storage medium 414 is communicatively coupled to the processor. The machine-readable storage medium 414 includes a number of instructions 416, 418, 420, 422 for performing a designated function. The machine-readable storage medium 414 causes the processor to execute the designated function of the instructions 416, 418, 420, 422. The machine-readable storage medium 414 can store data, programs, instructions, or any other machine-readable data that can be utilized to operate the electronic device 100. Machine-readable storage medium 414 can store computer readable instructions that the processor of the electronic device 100 can process, or execute. The machine-readable storage medium 414 can be an electronic, magnetic, optical, or other physical storage device that contains or stores executable instructions. Machine-readable storage medium 414 may be, for example, Random Access Memory (RAM), an Electrically Erasable Programmable Read-Only Memory (EEPROM), a storage device, an optical disc, etc. The machine-readable storage medium 414 may be a non-transitory machine-readable storage medium 414, where the term "non-transitory" does not encompass transitory propagating signals.

Referring to FIG. 4, determine instructions 416, when executed by the processor, cause the processor to, determine in parallel for a first, second, and third interval that are different from one another 1) a distinct average power draw over each interval, 2) a distinct interval throttle amount based on a comparison of the distinct average power draw over each interval with a threshold unique to each interval. In an example, the interval throttle amount is incremented when the average power draw over that interval is greater than a respective threshold and the interval throttle amount is decremented when the average power draw over that interval is less than the respective threshold. Weight instructions 418, when executed by the processor, may cause the processor to, weight a first, second, and third interval throttle amount. Select instructions 420, when executed by the processor, may cause the processor to, select the highest weighted interval throttle amount among the first throttle interval amount, the second interval throttle amount, and the third interval throttle amount as an overall throttle amount 110 for the electronic device 100. Reduce instructions 422, when executed by the processor, may cause the processor to, reduce the power draw from the power supply based on the overall throttle amount 110 for the electronic device 100.

What is claimed is:

1. An electronic device, comprising:
    a power meter to capture real-time power draw of the electronic device from a power supply;
    a controller to determine:
        an average power draw over a first interval;
        an average power draw over a second interval; and
        an overall throttle amount for the electronic device based on the average power draw over the first interval and the average power draw over the second interval; and
    a throttling device to reduce the power draw of the electronic device from the power supply based on the overall throttle amount for the electronic device.

2. The electronic device of claim 1, wherein the determined throttle amount for the electronic device is based on which of the average power draw over the first interval and the average power draw over the second interval is a greater distance away from a first interval threshold and a second interval threshold, respectively.

3. The electronic device of claim 2, wherein the first interval threshold and the second interval threshold are determined based on a power supply type.

4. The electronic device of claim 1, wherein the first interval is shorter than the second interval.

5. An electronic device, comprising:
a power meter to capture real-time power draw of the electronic device from a power supply;
a controller to:
 determine an average power draw over a first interval and an average power draw over a second interval, wherein the second interval is different than the first interval;
 compare, per interval, the average power draw to a distinct threshold for that interval; and
 determine, per interval, an interval throttle amount; and
 determine an overall throttle amount for the electronic device based on a first interval throttle amount and a second interval throttle amount; and
a throttling device to reduce the power draw of the electronic device from the power supply based on the overall throttle amount for the electronic device.

6. The electronic device of claim 5, wherein in determining, per interval, the interval throttle amount, the controller is to:
increase the interval throttle amount by a step size when the average power draw over that interval is greater than the distinct threshold for that interval; and
decrease the interval throttle amount by the step size when the average power draw is less than the distinct threshold for that interval, until the interval throttle amount is zero.

7. The electronic device of claim 6, wherein the step size is different per interval.

8. The electronic device of claim 6, wherein the step size is selected based on a time period associated with the distinct threshold for that interval.

9. The electronic device of claim 8, wherein:
the first interval is 0.1 milliseconds and a time period associated with the distinct threshold for the first interval is 2 milliseconds;
the second interval is 1 millisecond and a time period associated with the distinct threshold for the second interval is 30 milliseconds; and
the third interval is 1 second and a time period associated with the distinct threshold for the third interval is 10 seconds.

10. The electronic device of claim 5, wherein the controller comprises a latch to store the interval throttle amount.

11. The electronic device of claim 10, wherein for a subsequent interval, the controller is to:
increase the interval throttle amount by the step size when the average power draw is greater than the distinct threshold for that interval; and
decrease the interval throttle amount by the step size when the average power draw is less than the distinct threshold for that interval.

12. The electronic device of claim 5, wherein the controller is to determine the overall throttle amount for the electronic device by averaging the first interval throttle amount and the second interval throttle amount.

13. A non-transitory machine-readable storage medium encoded with instructions executable by a processor of an electronic device to, when executed by the processor, cause the processor to:
determine in parallel for a first, second, and third interval that are different from one another:
 a distinct average power draw over each interval;
 a distinct interval throttle amount based on a comparison of the distinct average power draw over each interval with a threshold unique to each interval, wherein:
  the interval throttle amount is incremented when the average power draw over that interval is greater than a respective threshold; and
  the interval throttle amount is decremented when the average power draw over that interval is less than the respective threshold;
weight a first, second, and third interval throttle amount;
select a highest weighted interval throttle amount among a first interval throttle amount, second interval throttle amount, and third interval throttle amount as an overall throttle amount for the electronic device; and
reduce the power draw of the electronic device from the power supply based on the overall throttle amount for the electronic device.

14. The non-transitory machine-readable storage medium of claim 13, wherein a weight is selected based on a property of the power supply.

15. The non-transitory machine-readable storage medium of claim 13, wherein a weight is different per interval.

* * * * *